United States Patent [19]

Carney

[11] 3,737,729

[45] June 5, 1973

[54] ELECTRONIC PACKAGE AND METHOD OF CONSTRUCTION

[75] Inventor: Durland B. Carney, Concord, Calif.

[73] Assignee: Zeltex, Inc., Concord, Calif.

[22] Filed: June 14, 1971

[21] Appl. No.: 152,874

[52] U.S. Cl. ..........317/101 PH, 29/627, 174/DIG. 3, 317/120

[51] Int. Cl. ..........H05k 5/00

[58] Field of Search ..........174/52 S, 52 PE, 174/DIG. 3; 317/101 CC, 101 PH, 118, 120; 338/312, 313; 339/17 C, 17 CF; 29/626, 627

[56] References Cited

UNITED STATES PATENTS

| | | | |
|---|---|---|---|
| 3,283,060 | 11/1966 | Wiese | 339/17 C |
| 3,441,853 | 4/1969 | Bodine | 317/101 CC |
| 3,501,582 | 3/1970 | Heidler | 174/52.6 |

FOREIGN PATENTS OR APPLICATIONS

| | | | |
|---|---|---|---|
| 23,272 | 10/1968 | Japan | 174/DIG. 3 |

*Primary Examiner*—Robert K. Schaefer
*Assistant Examiner*—Gerald P. Tolin
*Attorney*—Manfred M. Warren, Herbert Rubin, H. Michael et al.

[57] ABSTRACT

An electronic package including a case, circuit board, and elongated electric leads extending from the interior side of said circuit board to the outside of the case and having a snap action interfit with the case automatically locking the parts in attached position upon assembly. The exterior side of the circuit board is coated to provide the exterior side of the package.

5 Claims, 9 Drawing Figures

INVENTOR.
DURLAND B. CARNEY
BY
Warren, Rubin, Brucker & Chickering
ATTORNEYS

INVENTOR.
DURLAND B. CARNEY
BY
Warren, Rubin, Brucker & Chickering
ATTORNEYS

ELECTRONIC PACKAGE AND METHOD OF CONSTRUCTION

The invention relates to electronic apparatus and, more particularly, to cases and housing constructions therefor.

Electronic apparatus commonly employs circuit boards for mounting and connecting the various electronic components, and the circuit boards are, in turn, mounted within suitable cases or housings with electric leads brought out from the housing for connection to external circuitry. The present invention uses a novel mechanical association and co-functioning of the circuit board, leads and case to provide an improved production and assembly technique, resulting in optimum use space, the need for fewer parts and for an easier, more rapid and lower cost assembly of units.

Another object of the invention is to provide an electronic package of the character described which lends itself to modular construction with the electric leads serving as pins positioned for insertion in standard DIP PC board receptacles, and wherein the leads are afforded a range of movement for fitting standard spacings such as customary 0.5 inch and 0.6 inch center-to-center spacing found in dual in-line pin receptacle boards.

A further object of the present invention is to provide an electronic package of the above character which is tamper proof without the use of potting material and which may be nevertheless repaired when required.

The invention possesses other objects and features of advantage, some of which of the foregoing will be set forth in the following description of the preferred form of the invention which is illustrated in the drawings accompanying and forming part of this specification. It is to be understood, however, that variations in the showing made by the said drawings and description may be adopted within the scope of the invention as set forth in the claims.

Referring to said drawings.

Figure 1:
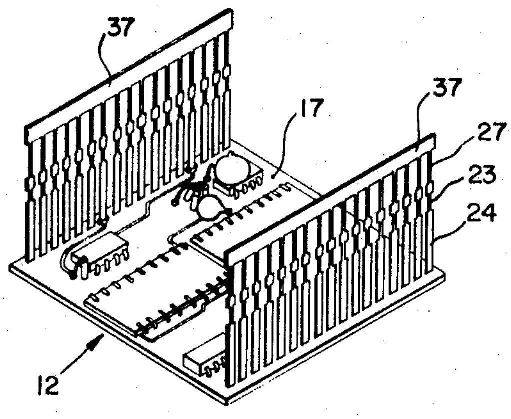
FIG. 1 is a perspective view of a part of the electronic package showing a first step in assembly.
Figure 6:
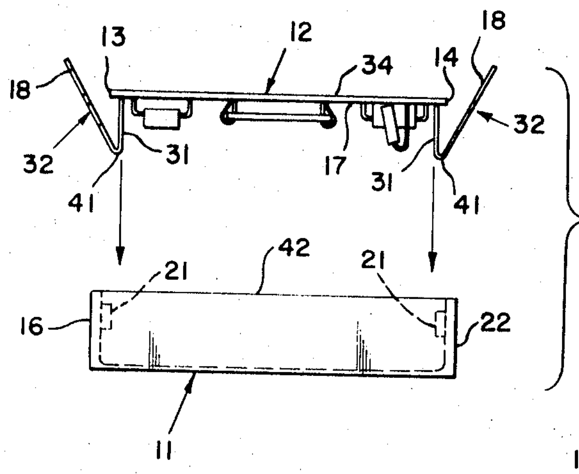
FIG. 6 is an exploded view of the circuit board and case parts of the package oriented for assembly.
Figure 7:
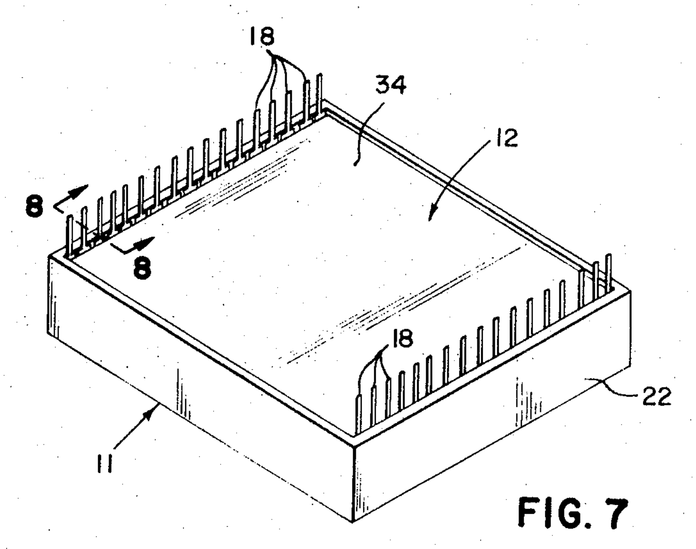
FIG. 7 is a perspective view of the completed package shown in normally inverted form.
Figure 9:
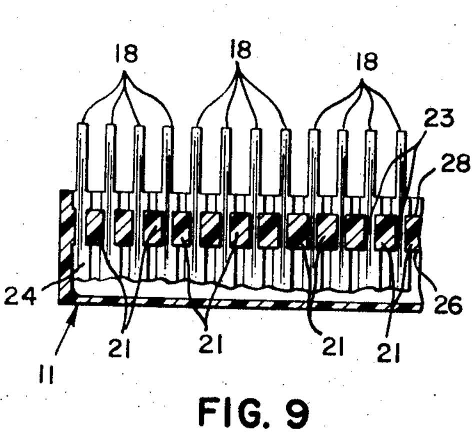
FIG. 9 is a fragmentary cross sectional view taken substantially on the plane of line 9—9 of FIG. 8.
Figure 8:
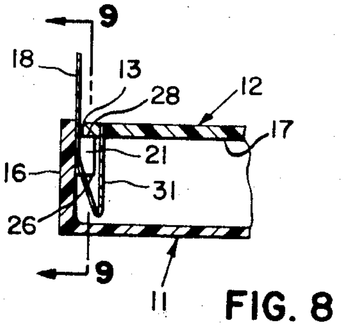
FIG. 8 is a fragmentary cross sectional view on an enlarged scale of a part of the package.

The electronic package of the present invention comprises briefly a case 11; a circuit board 12 having an edge 13, see FIG. 8, juxtaposed to a wall 16 of the case and having a side 17 disposed interiorly of the case for mounting of electronic components as depicted in FIGS. 1 and 6; and at least one elongated electric lead 18, see FIG. 8, formed of resilient material and connected to board 12 and extending from interior side 17 exteriorly of the package between edge 13 and wall 16 with the lead in resiliently pressed engagement with the wall; and means as best illustrated in FIGS. 8 and 9 interlocking lead 18 and wall 16 in assembled position. In accordance with the present invention, the interlocking means comprises interfitting portions on the lead and wall which automatically provided a snap interfit upon movement of the portions into registration. These portions here consist of a plurality of spaced projections 21 formed on wall 16 for accommodating a plurality of leads 18 here mounted at opposite side edges 13 and 14 of circuit board 12 and which cooperate with projections 21 on opposite side walls 16 and 22 of the case. The leads are formed of flat, elongated strips of current-conducting resilient material such as beryllium copper and which have reduced width portions 23 having a width fitting between projections 21 and relatively enlarged adjacent portions 24 which engage behind the interior ends 26 of projections 21 to lock the leads in place. As will be seen in FIGS. 1 and 2, portions 24 comprise the full width of the conductor strip whereas portions 23 are reduced in width so as to define a shoulder therebetween for interlocking behind the interior ends 26 of projections 21. The outer ends 27 of the strips are again reduced to standard pin size. As will also be best seen from FIG. 8, the outer surfaces 28 of projections 21 are lined up along the opposite walls 16 and 22 of the case to provide a support for the interior surface 17 of the circuit board whereby the latter is effectively locked in place on the case.

Preferably and as here shown, the leads are formed to provide leaf-type springs for resilient engagement with the side walls 16 and 22. Accordingly, the leaves are bent or otherwise formed of generally U-shape having a first leg or portion 31 extending interiorly of the case generally perpendicularly to side 17 and a contiguous second spring suspended leg or portion 32 extending from portion 31 at an acute angle; and importantly, the interlocking structure is provided on the second portion which also extends exteriorly of the case.

One of the important features of the present package is that the circuit board 12 becomes part of and, more specifically, the bottom of the case with the underside 34 of the circuit board defining the underside of the case. The lead latching construction avoids the need for potting and the entire interior space of the case becomes available for components thus maximizing the use of space and reduction in overall size. The pins 18 are located at the very edges of the circuit board and case which allows closely adjacent placement of other modular units. Also, the retaining of the leads between projections 21 provides a positive spacing and alignment of the leads while clearance between the confronting side edges of the circuit board and case permit considerable flexibility in location, row center line to center line, facilitating insertion into PC boards or PC board/socket combinations with considerable tolerance latitude. In this connection, it will be noted that the leads are not solidly captured in a lateral direction in the sockets provided by projections 21 but are permitted flexibility of motion to accommodate themselves to openings in the PC board.

Figure 5:
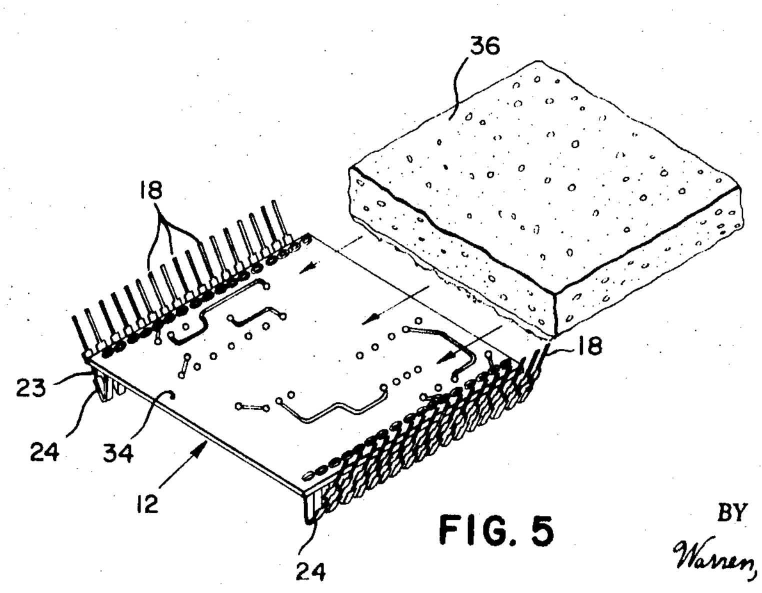

In order to effectively use the underside 34 of the circuit board as the exterior surface of the case, there is applied in accordance with the present invention a coating of electrical insulation material to this surface. An epoxy may be applied for this purpose, as by a sponge 36 as depicted in FIG. 5. An epoxy or other similar type material will provide a hard, durable exterior surface for the unit as well as electrical insulation. Preferably, a circuit board technique is used which provides a smooth, flush underside prior to the application of the coating.

The snap-in assembly of the circuit board and case as above described provides a tamper proof construction since the circuit board cannot be removed without breaking the case. When repair is required, the case will be broken, the circuit board removed and repaired, and then inserted into a new case.

Figure 2:
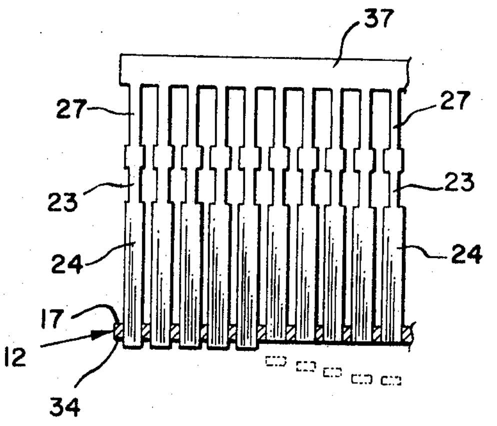
FIG. 2 is a cross sectional view.
Figure 3:
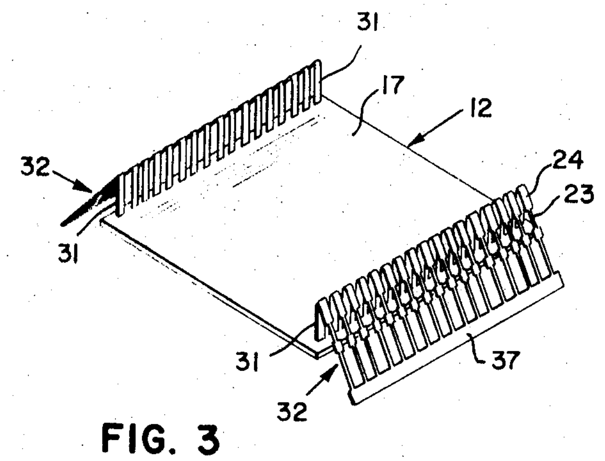
FIGS. 3, 4 and 5 are perspective views of the part shown in FIG. 1 in subsequent steps in the assembly of the package.
Figure 4:
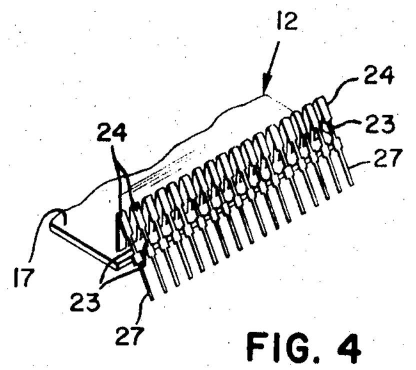

A description of the method of construction of the package follows. The leads are initially obtained as lead frames with a top frame bar 37. The first step is the conventional one of "stuffing" of components and lead frames into the top side 17 of the PC board which is then flow soldered in a conventional manner. The next step is the trimming of the leads flush with the bottom surface 34 of the circuit board as depicted in FIG. 2. The next step is the forming or bending of the lead frames to provide the acute angled portions 31 and 32 as seen in FIG. 3; and the trimming off of the lead frame tie bar as seen in FIG. 4 thus freeing up the individual leads. At this point the unit may be electrically tested before proceeding with the balance of the assembly steps.

The next step is the coating of the bottom side 34 of the board with the epoxy or equivalent coating. This can be conveniently done by inverting the assembly as seen in FIG. 5 so that the bottom side 34 is uppermost and the leads are at this point spaced widely from the opposite edges of the board leaving the surface of the board easily and fully accessible. A layer of epoxy or equivalent coating may be flowed onto the surface by means of a sponge 36, or the material may be brushed on or otherwise applied. Upon setting of the epoxy material, the circuit board and leads are ready for insertion into the case, and the two parts are preferably oriented for insertion as depicted in FIG. 6 so that the knees 41 of the leads are disposed in parallel rows and oriented to enter the open side 42 of case 11. The parts are preferably mounted in a press for the final step of telescopically displacing the parts to their final position. As the outturned lead portions 32 engage the rim of the case at the open upper extremities of walls 16 and 22, they are resiliently compressed inwardly so as to enter the case; and when the reduced portions 23 register with projections 21, the leads will spring outwardly with snap action into their interlocked position as shown in FIG. 9.

I claim:

1. An electronic package comprising:

a case having a closed side and a peripheral wall;

a circuit board carried by and providing a closure for said case;

a plurality of U-shaped spring leads each having one leg connected to and extending interiorly from the interior side of said board and a spring-leg portion thereof extending from said first named leg to a position exterior of said case and in resilient compression against said case wall; and snap means formed by said wall and at least one of said spring-leg portions in resilient compression against said case wall holding said board in position in relation to the case.

2. A package as defined in claim 1, said leads being disposed on parallel rows adjacent opposite edges of said board;

said wall confronting said edges being formed with a plurality of spaced projections forming interfitting portions to cofunction with said resilient compression of said spring-leg; and at least certain of said spring-legs having a width fitting between said projections and provided with enlarged portions engaging behind the interior ends of said projections locking said board and case together.

3. A package as defined in claim 2, the exterior ends of at least certain of said projections providing a seat for said board.

4. An electronic package as defined in claim 1, and a coating of electrical insulation material mounted on the opposite side of said circuit board and defining an exterior side of said package.

5. A method of constructing an electronic package having externally extending leads, a case having a closed side and a peripheral wall, a circuit board dimensioned for fitting within said case with the side edges of said board confronting said peripheral wall, and electronic components, comprising:

mounting of said components on a first side of said board;

selecting leads of resilient current conducting material and attaching said leads to said board adjacent its periphery to extend from said first board side;

connecting said components and leads at the opposite side of said board in a manner providing a substantially smooth surface at said second side;

forming said leads with spring suspended legs extending in a reverse direction to overlie opposite side edges of said board in spaced relation thereto;

forming said legs and peripheral wall with interfitting and interlocking portions;

coating said second side of said board with an electrical insulation material defining an exterior side of said package;

positioning said board with its first side facing interiorally of said case toward the closed side thereof with said legs engaged with said peripheral wall; and moving said board in a direction interiorally of said case resiliently compressing said legs against said peripheral wall and until said portions are moved into registration to effect snap action latching of said board and case.

* * * * *